US010644064B2

(12) United States Patent
Lee et al.

(10) Patent No.: US 10,644,064 B2
(45) Date of Patent: May 5, 2020

(54) LOGIC CHIP INCLUDING EMBEDDED MAGNETIC TUNNEL JUNCTIONS

(71) Applicant: Intel Corporation, Santa Clara, CA (US)

(72) Inventors: Kevin J. Lee, Beaverton, OR (US); Tahir Ghani, Portland, OR (US); Joseph M. Steigerwald, Forest Grove, OR (US); John H. Epple, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/959,027

(22) Filed: Apr. 20, 2018

(65) Prior Publication Data

US 2018/0277593 A1 Sep. 27, 2018

Related U.S. Application Data

(63) Continuation of application No. 15/596,650, filed on May 16, 2017, now Pat. No. 9,997,563, which is a
(Continued)

(51) Int. Cl.
*H01L 27/22* (2006.01)
*H01L 43/12* (2006.01)
(Continued)

(52) U.S. Cl.
CPC .......... *H01L 27/222* (2013.01); *G11C 11/161* (2013.01); *H01L 43/08* (2013.01); *H01L 43/12* (2013.01)

(58) Field of Classification Search
None
See application file for complete search history.

(56) References Cited

U.S. PATENT DOCUMENTS 5,686,329 A * 11/1997 Chang ............... H01L 21/28061
257/E21.2
6,972,265 B1 12/2005 Schwarz
(Continued)

FOREIGN PATENT DOCUMENTS

CN 101055915 A 10/2007
CN 102272847 A 12/2011
(Continued)

OTHER PUBLICATIONS

Office Action from U.S. Appl. No. 15/596,650, dated Oct. 11, 2017, 15 pages.
(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

An embodiment integrates memory, such as spin-torque transfer magnetoresistive random access memory (STT-M RAM) within a logic chip. The STT-MRAM includes a magnetic tunnel junction (MTJ) that has an upper MTJ layer, a lower MTJ layer, and a tunnel barrier directly contacting the upper MTJ layer and the lower MTJ layer; wherein the upper MTJ layer includes an upper MTJ layer sidewall and the lower MTJ layer includes a lower MTJ sidewall horizontally offset from the upper MTJ layer. Another embodiment includes a memory area, comprising a MTJ, and a logic area located on a substrate; wherein a horizontal plane intersects the MTJ, a first Inter-Layer Dielectric (ILD) material adjacent the MTJ, and a second ILD material included in the logic area, the first and second ILD materials being unequal to one another. Other embodiments are described herein.

20 Claims, 10 Drawing Sheets

Related U.S. Application Data continuation of application No. 13/994,715, filed as application No. PCT/US2013/031994 on Mar. 15, 2013, now Pat. No. 9,660,181.

(51) Int. Cl.
    *H01L 43/08*     (2006.01)
    *G11C 11/16*     (2006.01)

(56) References Cited

U.S. PATENT DOCUMENTS

| | | | |
|---|---|---|---|
| 6,982,446 B2 | 1/2006 | Motoyoshi | |
| 7,242,067 B1 | 7/2007 | Signorini | |
| 7,919,794 B2 | 4/2011 | Gu et al. | |
| 9,041,146 B2 | 5/2015 | Lee et al. | |
| 9,660,181 B2 | 5/2017 | Lee | |
| 2003/0067800 A1* | 4/2003 | Koganei | G11C 11/15 365/158 |
| 2006/0234445 A1* | 10/2006 | Yang | H01L 43/12 438/257 |
| 2007/0026681 A1 | 2/2007 | Shiraiwa et al. | |
| 2007/0159735 A1 | 7/2007 | Butcher | |
| 2009/0256220 A1 | 10/2009 | Horng et al. | |
| 2009/0261433 A1 | 10/2009 | Kang et al. | |
| 2009/0261437 A1 | 10/2009 | Kang et al. | |
| 2009/0291388 A1 | 11/2009 | Assefa et al. | |
| 2009/0302405 A1 | 12/2009 | Gaidis et al. | |
| 2010/0080894 A1* | 4/2010 | Tsunekawa | B82Y 25/00 427/131 |
| 2010/0172173 A1 | 7/2010 | Abu-Rahma et al. | |
| 2010/0181633 A1 | 7/2010 | Nam et al. | |
| 2010/0289098 A1 | 11/2010 | Li et al. | |
| 2010/0297820 A1 | 11/2010 | Lee et al. | |
| 2011/0049657 A1 | 3/2011 | Tsukamoto et al. | |
| 2012/0091413 A1 | 4/2012 | Nguyen | |
| 2012/0228728 A1 | 9/2012 | Ueki et al. | |
| 2012/0299133 A1 | 11/2012 | Son et al. | |
| 2013/0001652 A1 | 1/2013 | Yoshikawa et al. | |
| 2013/0015541 A1 | 1/2013 | Kanaya | |

FOREIGN PATENT DOCUMENTS

| | | |
|---|---|---|
| JP | 2001168418 | 6/2001 |
| JP | 2003322650 | 11/2003 |
| JP | 2004228187 | 8/2004 |
| JP | 2005072491 | 3/2005 |
| JP | 2011041951 | 3/2011 |
| JP | 2011066190 | 3/2011 |
| JP | 2011066015 | 8/2011 |
| JP | 2012-186372 | 9/2012 |
| JP | 2013016587 | 1/2013 |
| JP | 2013522931 | 6/2013 |
| KR | 10-2010-0094905 | 8/2010 |
| KR | 10-2013-0007410 | 1/2013 |

OTHER PUBLICATIONS

Office Action from U.S. Appl. No. 13/994,715, dated Jul. 8, 2015, 19 pages.
Office Action from U.S. Appl. No. 13/994,715, dated Aug. 12, 2016, 14 pages.
Notice of Allowance from Chinese Patent Application No. 201380073040.2, dated Nov. 11, 2017.
Notice of Allowance from Japanese Patent Application No. 2016-500058, dated May 16, 2017.
International Preliminary Report on Patentability for PCT/US2013/031994, dated Sep. 15, 2015, 7 pages.
International Search Report and Written Opinion for Application Serial No. PCT/US2013/031994 dated Dec. 13, 2013.
Japan Patent Office, Notice of Rejection dated Dec. 6, 2016 in Japanese Patent Application No. 2016-500058.
Dow Corning, "Material Safety Data Sheet FOX(R) ~ 14 Flowobte Oxide" Dow Corning Corporation, Jan. 28, 2013, 9 pages.
Lis, S., et al., Application of Flowable Oxides in Phonics° Materials Science, Nov. 1, 2008, 6 pages, Poland, vol. 26.
U.S. Appl. No. 13/994,716 entitled "Logic Chip Including Embedded Magnet Tunnel Junctions" by Kevin J. Lee, filed Jun. 15, 2013.
State Intellectual Property Office of the People's Republic of China, Notification of the First Office Action dated May 3, 2017 in Chinese Patent Application No. 201380073040.2.
State Intellectual Property Office of the People's Republic of China, Notification of the Second Office Action dated Aug. 17, 2017 in Chinese Patent Application No. 201380073040.2.
Office Action from Great Britain Patent Application No. 1513901.7, dated May 21, 2019, 6 pgs.
Office Action from Korean Patent Application No. 10-2015-7021347, dated Jul. 9, 2019, 9 pgs.

* cited by examiner

US 10,644,064 B2

LOGIC CHIP INCLUDING EMBEDDED MAGNETIC TUNNEL JUNCTIONS

This application is a continuation of U.S. patent application Ser. No. 15/596,650, filed May 16, 2017, which is a continuation of U.S. patent application Ser. No. 13/994,715, filed Jun. 15, 2013, now U.S. Pat. No. 9,660,181 which is a § 371 National Stage Entry of International Application No. PCT/US2013/031994, filed Mar. 15, 2013. The content of each of the above applications is hereby incorporated by reference.

TECHNICAL FIELD

Embodiments of the invention are in the field of semiconductor devices and, in particular, logic chips having embedded memory.

BACKGROUND

Integrating memory directly onto a logic chip (e.g., microprocessor chip) enables wider buses and higher operation speeds compared to having physically separate logic and memory chips. Such memory may include traditional charge-based memory technologies such as dynamic random-access memory (DRAM) and NAND Flash memory.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
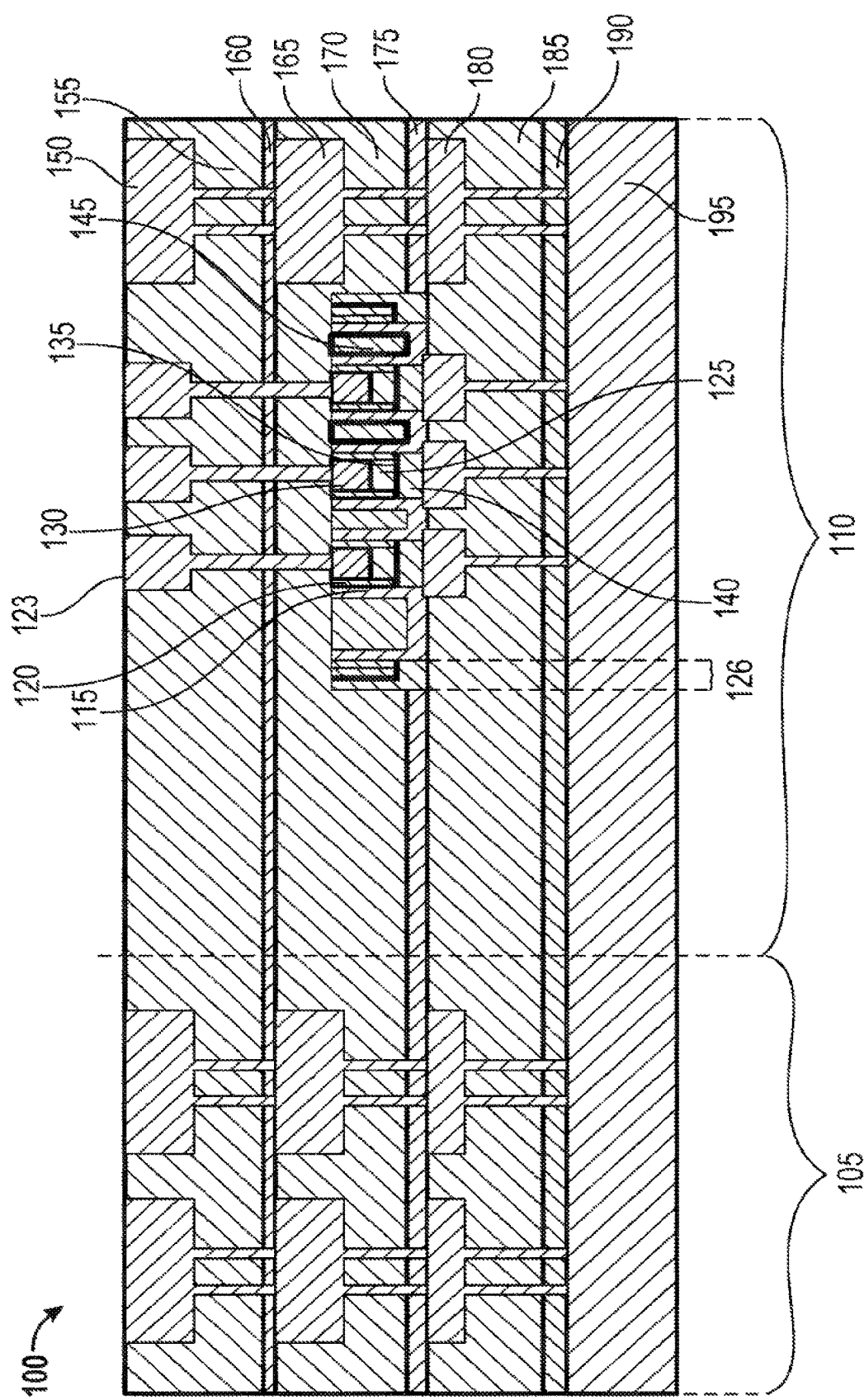
FIG. 1 depicts a logic chip including embedded magnetic tunnel junctions in an embodiment of the invention.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment. Terms such as "upper" and "lower" "above" and "below" may be understood by reference to the illustrated X-Z coordinates, and terms such as "adjacent" may be understood by reference to X-Y coordinates or to non-Z coordinates.

As stated above, integrating memory directly onto a logic chip has advantages. Such memory may include DRAM and NAND Flash memory. However, DRAM and NAND Flash memory have scalability issues related to increasingly precise charge placement and sensing requirements, and hence embedding charge-based memory directly onto a high performance logic chip is problematic at, for example, sub-20 nm technology nodes.

An embodiment includes a logic chip integrated with a memory; however the memory scales to smaller geometries than possible with traditional charge-based memories. In one embodiment the memory is a spin-torque transfer magnetoresistive random access memory (STT-MRAM), which relies on resistivity rather than charge as the information carrier. More specifically, an embodiment includes at least one STT-MRAM memory embedded within a back-end interconnect layer of a logic chip (e.g., processor). The at least one STT-MRAM memory may include at least one STT-MRAM array having at least one magnetic tunnel junction (MTJ). Other memories besides STT-MRAM, such as resistive RAM (RRAM), are used in other embodiments.

An embodiment integrates a STT-MRAM within a logic chip, where the memory includes a MTJ that has an upper MTJ layer, a lower MTJ layer, and a tunnel barrier directly contacting the upper MTJ layer and the lower MTJ layer; wherein the upper MTJ layer includes an upper MTJ layer sidewall and the lower MTJ layer includes a lower MTJ sidewall horizontally offset from the upper MTJ layer. Another embodiment includes a memory area, comprising a MTJ, and a logic area located on a substrate; wherein a horizontal plane intersects the MTJ, a first Inter-Layer Dielectric (ILD) material adjacent the MTJ, and a second ILD material included in the logic area, the first and second ILD materials being unequal to one another. Other embodiments are described herein.

FIG. 1 depicts a logic chip including embedded MTJs in an embodiment. Although MTJs may comprise multiple layers of very thin metal films, for discussion purposes the MTJ film stack is divided into four portions in FIG. 1: "bottom MTJ" 140 (the bottom layer of the MTJ), "tunnel barrier" 135, "top MTJ" 125 (the top layer of the MTJ), and hardmask layer 130. FIG. 1 shows three MTJs all included in M2 metal layer 165. The three MTJs are included on silicon substrate 195 and various build up layers generally represented by layer 190. The three MTJs are shown as being embedded in M2 165 for discussion purposes but could be embedded in other interconnect layers such as metal layers M1 180, M3 150, and the like.

For clarity purposes some details are not labeled in FIG. 1 but those details will become clearer when discussing a manufacturing process for the device of FIG. 1 using FIGS. 2-23. For example, although there are several spacer portions in FIG. 1 possibly only one such portion is labeled for purposes of clarity. However, other portions may be labeled in one or more of FIGS. 2-23.

In the embodiment of FIG. 1 sidewall spacer 120 is located along the edges of patterned hardmask 130 and top MTJ 125 films. Sidewall spacer 120 protects the edges of top MTJ 125 films from oxidation and/or corrosion.

In an embodiment there is horizontal separation between the edges of hardmask 130 and top MTJ 125 films compared to the edges of tunnel barrier 135 and bottom MTJ 140 films. This horizontal separation provides a margin with respect to top MTJ-to-bottom MTJ shorting.

An embodiment includes remnants of polish-stop film 115 on the edges of tunnel barrier 135 and bottom MTJ 140 films. Film 115 protects tunnel barrier 135 film and bottom MTJ 140 films from sidewall oxidation and/or corrosion.

An embodiment retains the same regular low-k ILD material 155, 170, 185 in logic area 105 (e.g., processor) and memory layer 110 that includes embedded MTJs. Doing so helps the embodiment meet stringent RC delay requirements of modern high performance logic chips. However, area 110 also includes flowable oxide layer 145, which provides an ILD not found in area 105 (or at least portions of area 105).

FIG. 1 shows four elements: (1) sidewall spacer 120, (2) horizontal separation between the edges of hardmask 130 and top MTJ 125 films compared to the edges of tunnel barrier 135 and bottom MTJ 140 films, (3) remnants of polish-stop film 115 on the edges of tunnel barrier 135 and bottom MTJ 140 films, and (4) the same regular low-k ILD material 155, 170, 185 in logic area 105 (e.g., processor) and memory layer 110, other embodiments need not include all of these elements. Other embodiments may include any combination or subset of these four elements such as, for example, elements (1) and (2) but not elements (3) and/or (4).

Figure 2:
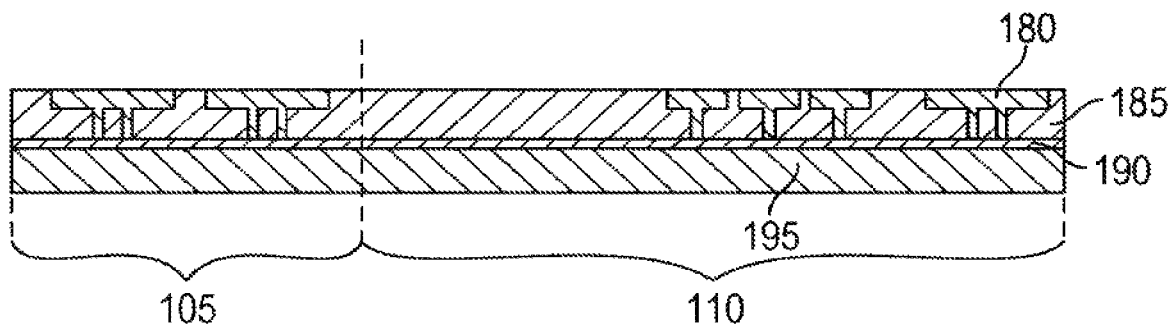
FIGS. 2-23 depict a process for fabricating a logic chip including embedded magnetic tunnel junctions in an embodiment of the invention.

FIGS. 2-23 depict a process for fabricating a logic chip area 105 including an embedded MTJ area 110 in an embodiment of the invention. In FIG. 2 the process sequence begins with wafer 195 on which the topmost surface has a patterned interconnect layer within M1 layer 180. M1 layer 180 is included within ILD 185. For the purposes of discussion the process flow is shown beginning with a wafer having a patterned M1 interconnect on its topmost surface, but the topmost surface could be some other interconnect layer (i.e. M2, M3, M4 and the like). Wafer 195 may also have other back-end and front-end layers 190 beneath the topmost patterned interconnect layers.

Figure 3:
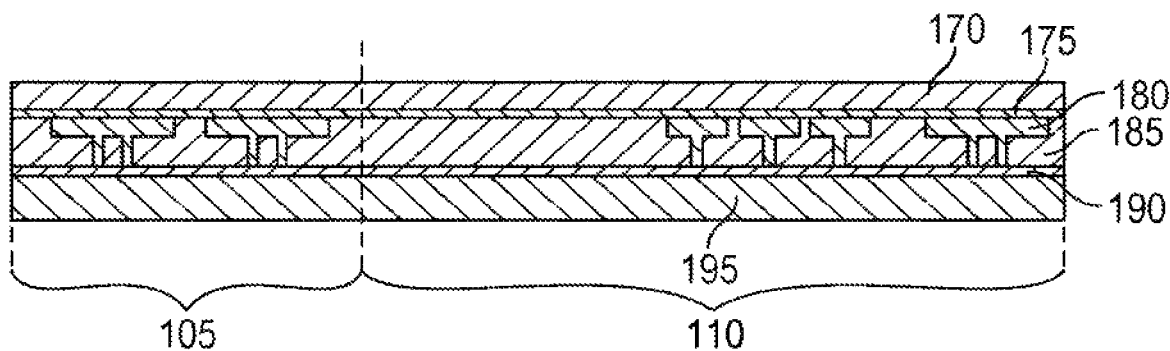

In FIG. 3 etch-stop film 175 is deposited followed by low-k ILD 170 material. In an embodiment, ILD material 170 will ultimately remain in the area of the wafer where the logic circuits are located (area 105). Areas 105, 110 may be identified in a variety of ways. For example, area 110 may include a STT-RAM bit cell array where MTJs are visible and a fairly regular bit cell transistor layout is present. In contrast, the transistor layout in area 105 is not so regular (e.g., not included in a repetitively structured array as is the case with memory) and few to no MTJs are present.

ILD 170 satisfies various technical requirements for ILD material(s) used in the corresponding interconnect layer of area 105. Such technical requirements may concern, for example, electrical properties (e.g., dielectric constant, breakdown voltage) and/or mechanical properties (e.g., modulus, toughness, film stress) dictated by design concerns for area 105. In various embodiments etch-stop materials include, for example, silicon nitride, silicon carbide, carbon-doped silicon nitride, and the like. ILD material 170 may be any ILD material whose properties are suitable for use in the logic circuits and interconnect layer of area 105. Embodiments include ILD materials such as, for example, silicon oxide, fluorinated silicon oxide (SiOF), and carbon-doped oxide.

Figure 4:
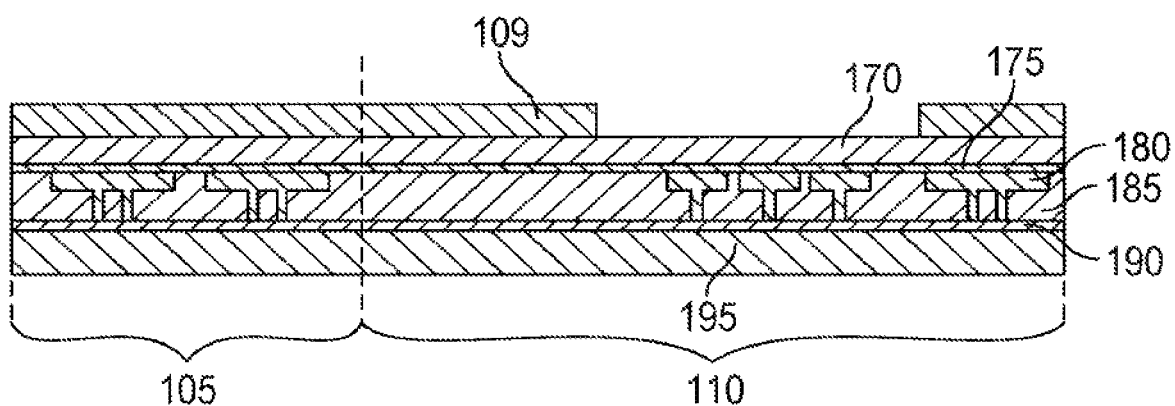
Figure 5:
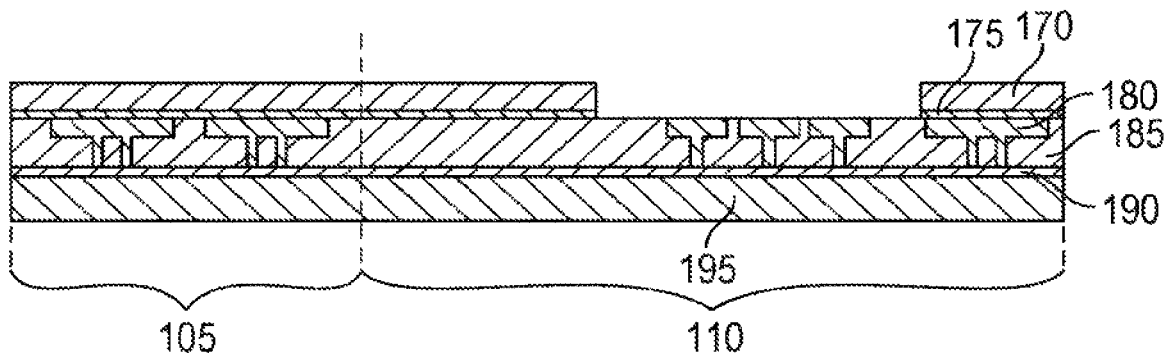

In FIG. 4 resist layer 109 is applied and patterned to mask off logic circuit area 105 from the area 110 where MTJs will be fabricated. In FIG. 5 low-k ILD 170 and etch-stop layer 175 are etched away in the unmasked areas to expose underlying M1 180 interconnect layer by using a dry etch process and any resist residue is then removed using clean processing.

Figure 6:
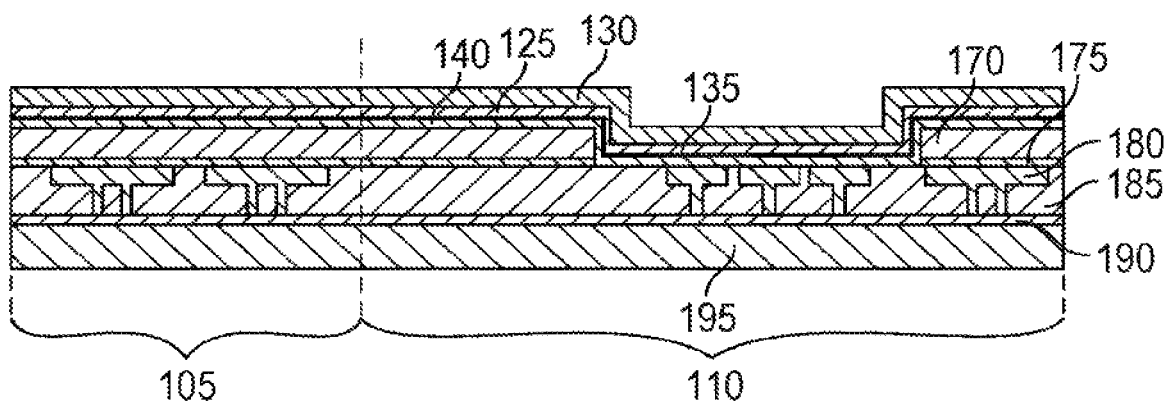

In FIG. 6 the MTJ metal film stack (layers 140, 135, 125) is deposited followed by the deposition of hardmask 130 material. In an embodiment the method of depositing the MTJ metal film stack is physical vapor deposition (PVD) sputtering. In an embodiment bottom MTJ film 140 consists of (from bottom to top) 3 nm tantalum (Ta); 20 nm platinum manganese (PtMn); 2.3 nm cobalt iron ($Co_{70}Fe_{30}$); 0.8 nm Ruthenium (Ru); 2.5 nm cobalt iron boron ($Co_{60}Fe_{20}B_{20}$), tunnel barrier 135 includes 1.2 nm magnesium oxide (MgO), top MTJ 125 film includes 2.5 nm $Co_{60}Fe_{20}B_{20}$, and hardmask 130 material includes 50 nm Ta. In such an embodiment the hardmask (1) can be deposited sequentially within the same sputter tool that is used for depositing the MTJ metal film stack, and (2) is conductive. Regarding the sputter tool, since all films in the hardmask, top MTJ, tunnel barrier, and bottom MTJ are sputtered films, all of those films may be deposited sequentially inside one sputter tool without breaking vacuum. An advantage of not breaking vacuum is that the surfaces of the various metal films do not oxidize, and hence there is little to no deterioration of the electrical properties of the MTJ layers. Regarding the conductive nature of the hardmask, as a result of the conductivity of the hardmask the hardmask does not need to be removed later in the flow when an electrical connection needs to be made to the top surface of the MTJ. Other embodiments have other thicknesses for bottom MTJ 140, tunnel barrier 135, and/or top MTJ 125 to alter the MTJ electrical characteristics as desired. Likewise, other materials may be used in bottom MTJ 140, tunnel barrier 135, top MTJ 125, and hardmask 130 to obtain different MTJ electrical characteristics, as desired.

Figure 7:
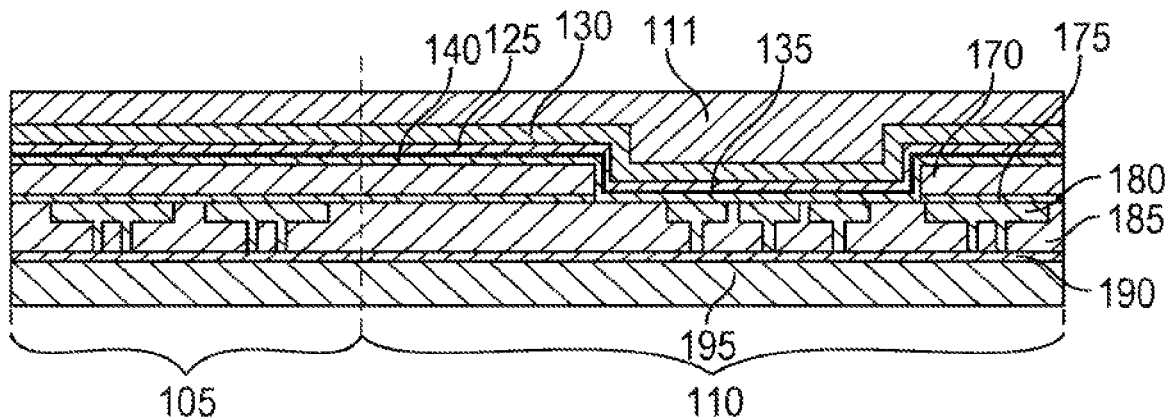
Figure 8:
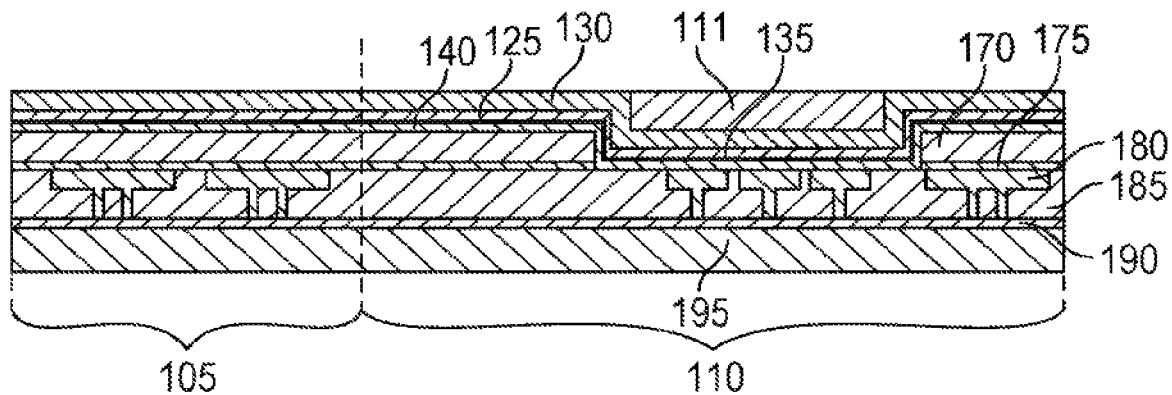

In FIG. 7 planarizing coating 111 is applied. In FIG. 8a planarizing coating overburden is removed using a chemical-mechanical polishing (CMP) process. Note that planarizing coating 111 material remains inside a recessed area of the wafer. Bottom MTJ layer 140 is horizontally adjacent ILD 170 and etch-stop 175. Bottom MTJ layer 140 is vertically adjacent and "on" ILD 185, which may be located over other various layers 190 and substrate 195. Alternative embodiments may forego CMP of portions such as portion 111. Alternative embodiments may forego CMP of sacrificial light absorbing material (SLAM) deposited in, for example, the recessed area of the wafer.

Figure 9:
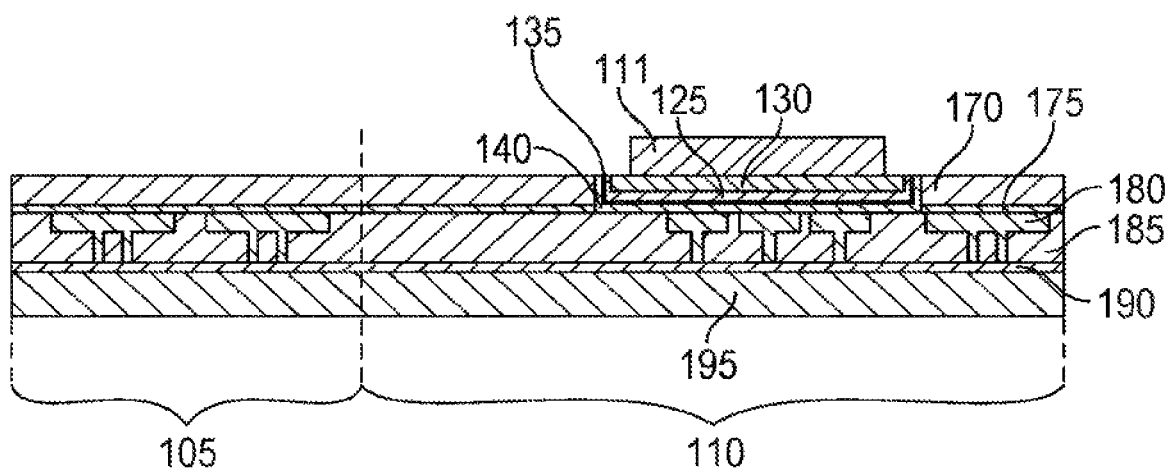
Figure 10:
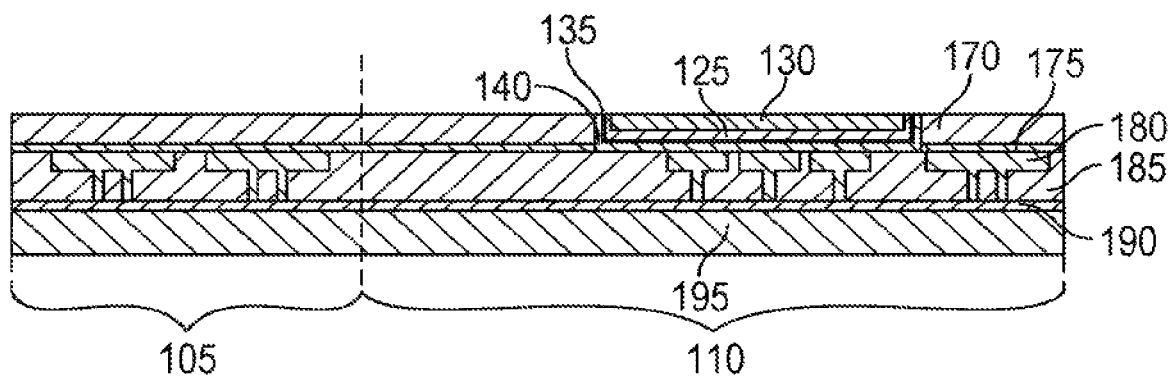
Figure 11:
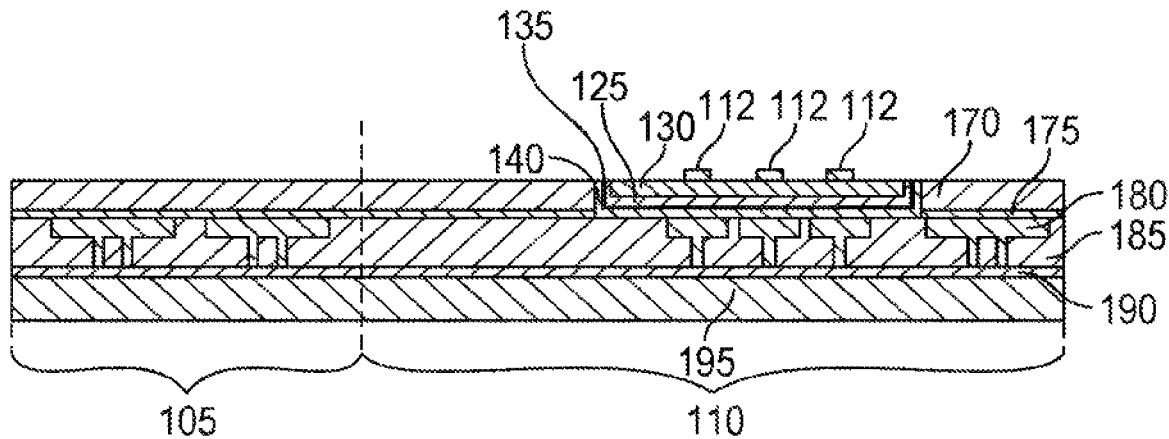
Figure 12:
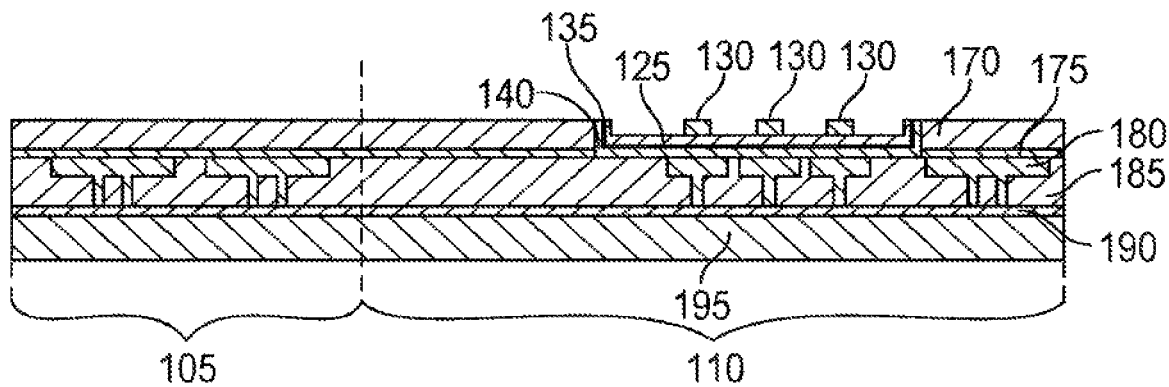
Figure 13:
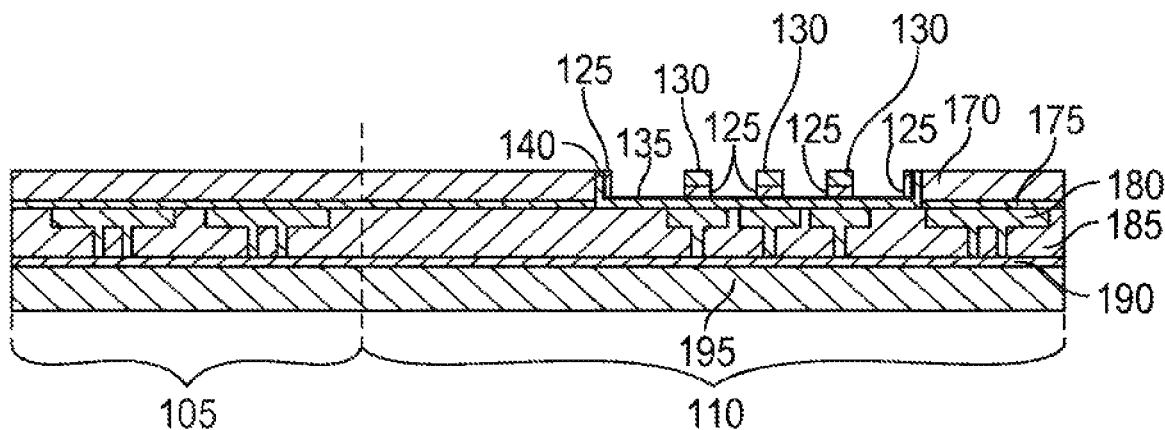
Figure 14:
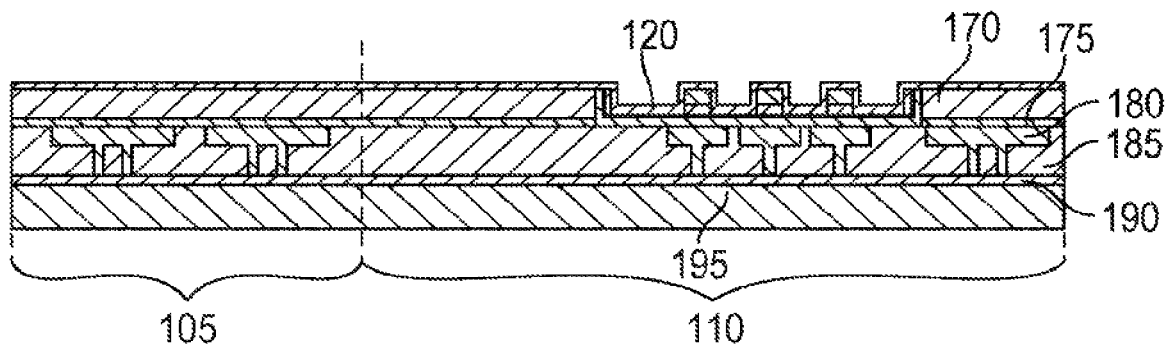
Figure 15:
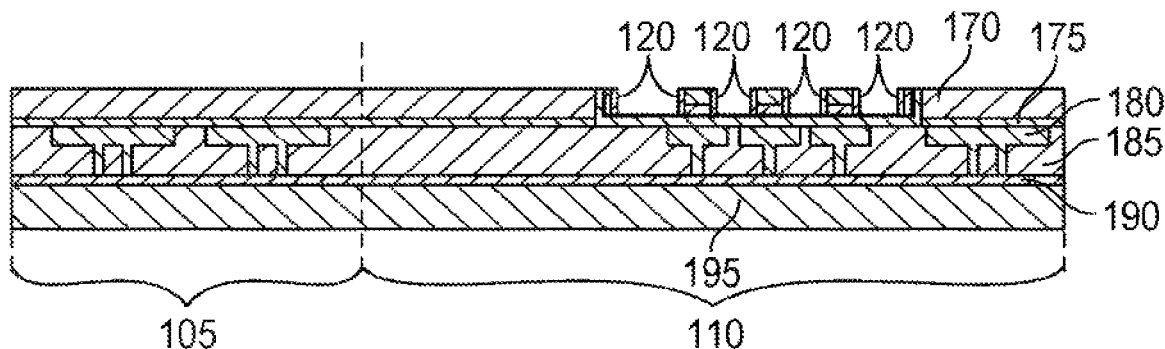
Figure 16:
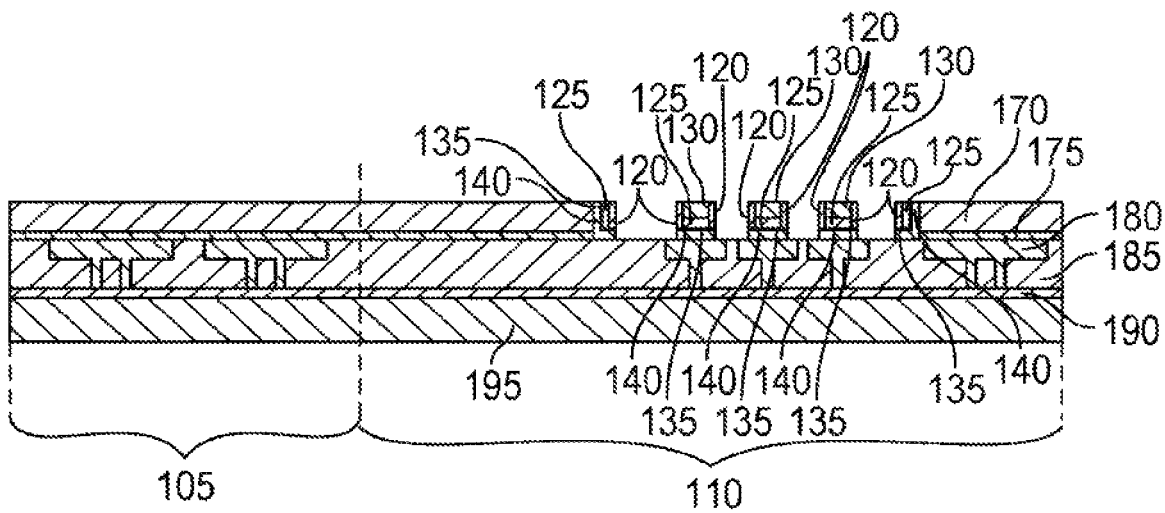
Figure 17:
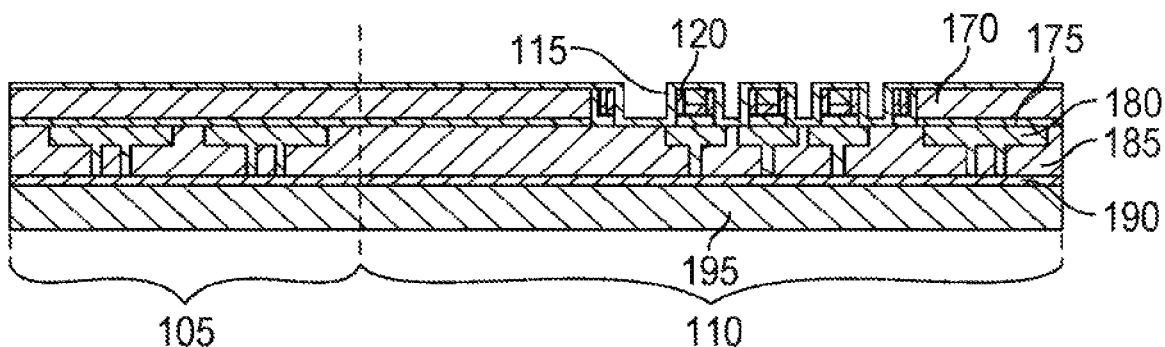

In FIG. 9 exposed hardmask 130, top MTJ 125, tunnel barrier 135, and bottom MTJ 140 films are removed using reactive-ion etching (RIE) dry etch techniques, stopping at low-k ILD 170. In FIG. 10 remaining planarizing material 111 is removed using, for example, wet or dry etch techniques. In FIG. 11 resist layer 112 is applied and patterned over those areas of the wafer surface where MTJs are desired (area 110). In FIG. 12 exposed hardmask 130 material is etched using, for example, dry etch techniques and any remaining resist is removed using, for example, a plasma ash process. In FIG. 13 top MTJ film 125 is etched using, for example, RIE dry etch techniques, stopping at tunnel barrier 135 material. In FIG. 14 the wafer surface is covered with "spacer" 120 film, such as, for example, silicon nitride, silicon oxide, silicon oxynitride, silicon carbide, or carbon doped silicon nitride. In FIG. 15 an anisotropic dry etch process is used to remove spacer 120 material from all of the horizontal surfaces of the wafer while leaving the spacer material on the vertical sidewalls. In FIG. 16 tunnel barrier 135 and bottom MTJ films 140 are etched using, for example, RIE dry etch techniques, stopping on the underlying M1 180 interconnect and/or ILD 185 materials. In FIG. 17 the wafer surface is covered with polish-stop material 115, such as silicon nitride or silicon carbide. Note that film 115 acts as a flowable oxide polish stop (explained further at FIG. 19), and (2) it protects the etched sidewalls of the tunnel barrier and bottom MTJ films from oxidation/corrosion.

In one embodiment the processes corresponding to FIGS. 12-17 occur in-situ in a large cluster tool without breaking vacuum in order to minimize any chance of oxidation or corrosion of the etched MTJ sidewalls.

Figure 18:
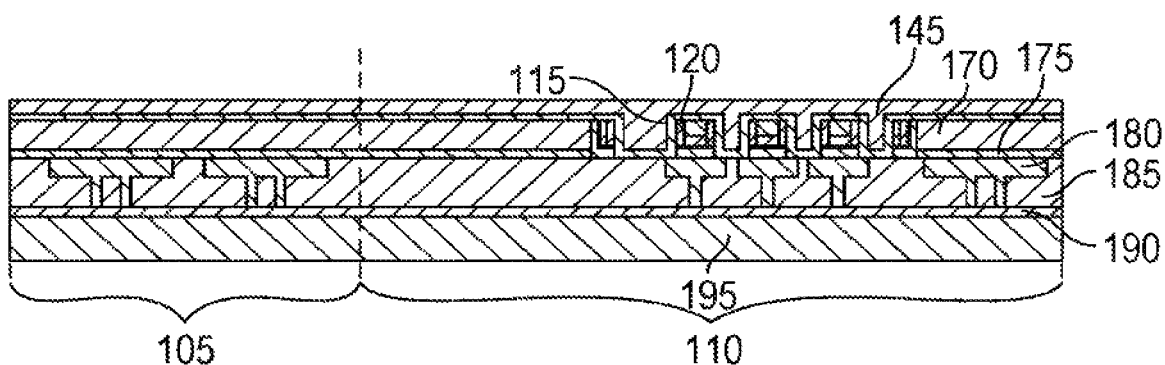

In FIG. 18 the wafer surface is covered with flowable oxide material 145, which may fill any gaps between MTJs. In one embodiment flowable oxide material 145 may include polymer hydrogen silsesquioxane (HSQ) solution in methyl isobutyl ketone (MIBK), but other embodiments are not so limited.

Figure 19:
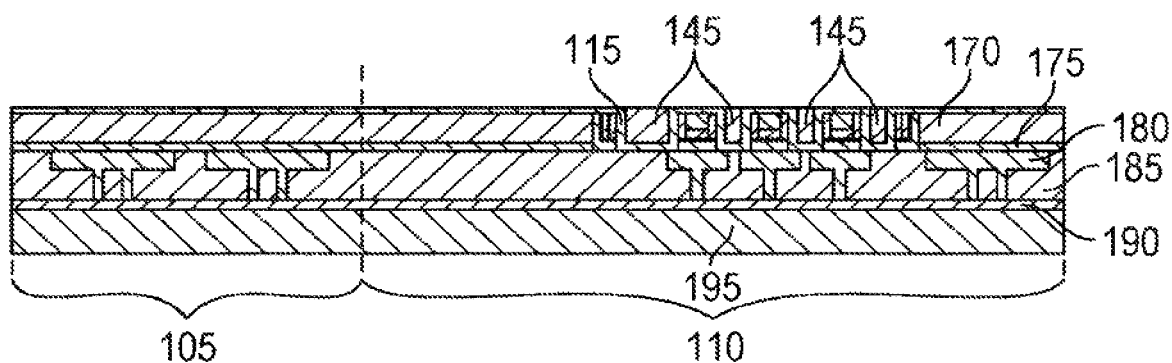
Figure 20:
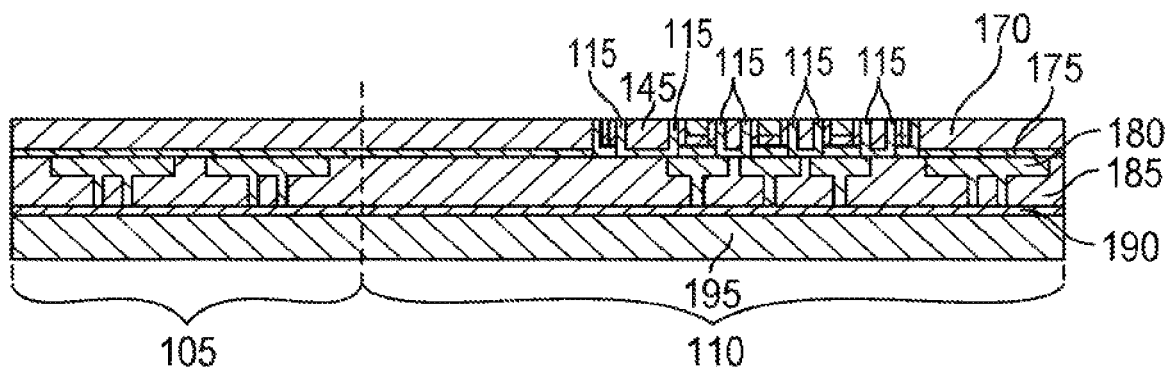
Figure 21:
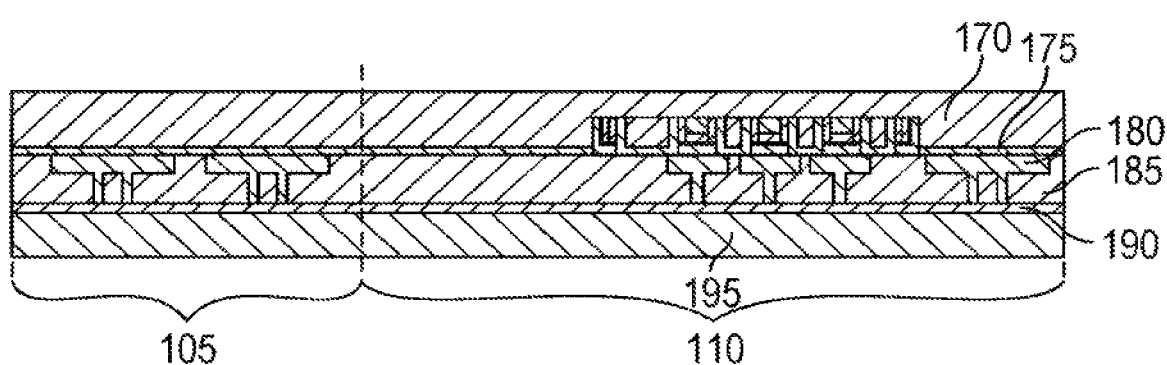

In FIG. 19 flowable oxide 145 overburden is removed using, for example, an oxide CMP process that selectively stops on underlying polish-stop 115 material. In an embodiment flowable oxide material 145 remains in the gaps between the MTJs. In FIG. 20 exposed polish-stop 115 material is removed using, for example, a plasma etch process. In FIG. 21 additional low-k ILD material 170 is deposited onto the wafer, such that the total low-k ILD thickness is built up to a value desired for forming the regular interconnect structures in the logic circuit areas. This value is highly variable and depends on, for example, which metal layer the MTJs are integrated into. In one embodiment, the total low-k ILD thickness may be between 30-750 nm, including 50, 100, 200, 300, 400, 500, 600, 700 nm thicknesses.

Figure 22:
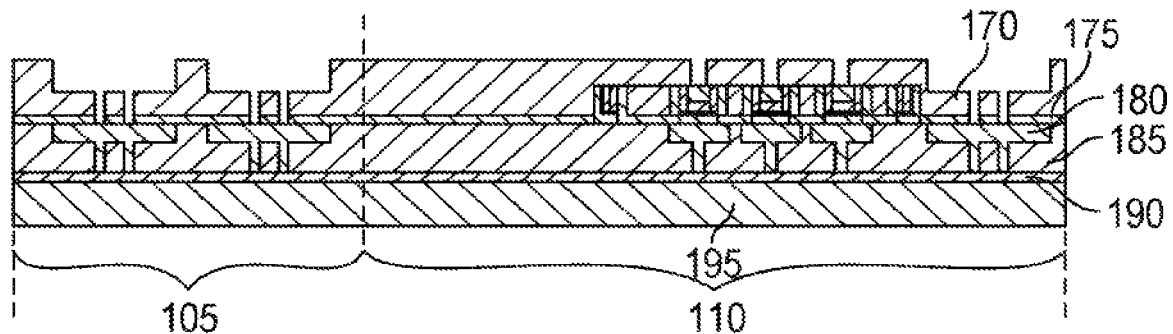
Figure 23:
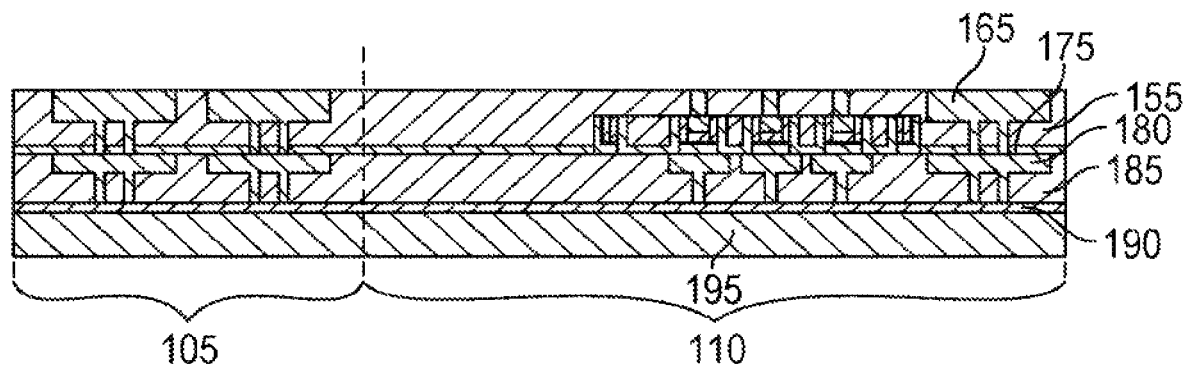

In FIG. 22 trenches and via openings are fabricated into low-k ILD material 170 using, for example, dual damascene patterning. In FIG. 23 copper interconnect structures are formed inside the trenches and via openings using, for example, dual damascene barrier/seed deposition, copper electroplating, and copper CMP processes.

The process then produces the device included in FIG. 1, wherein subsequent etch stop 160 is formed and copper interconnect layer(s) 123 are formed in M3 layer 150. Furthermore, ILD layer(s) 155 are formed, as desired, using, for example, dual damascene process techniques.

Figure 24:
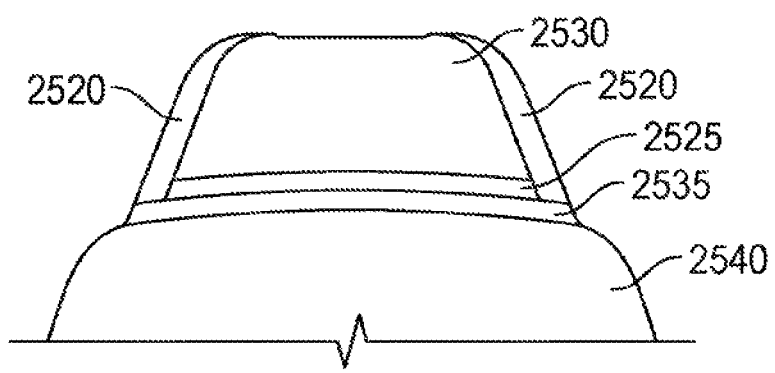
FIG. 24 depicts a magnetic tunnel junction in an embodiment of the invention.

FIG. 24 includes a less idealized version of a portion of FIG. 1. In FIG. 24 tunnel barrier 2435 is located between bottom MTJ layer 2540 and top MTJ layer 2525. Spacer 2520 is vertically adjacent layer 2535 and horizontally adjacent layer 2525 and hardmask 2530.

In another embodiment the same product as that of FIG. 1 is produced. The process and embodiments of FIGS. 2-6 are used. However, going forward from the product of FIG. 6 the process differs. Namely, photoresist is applied and patterned to mask off the MTJ array area the wafer surface. For example, resist is located within the recessed area of the wafer (i.e., between the two nearly orthogonal horizontal to vertical MTJ stack transitions shown in FIG. 6). The resist may be patterned or deposited to be present solely within this recessed area or may expand horizontally beyond the area. The resist may also extend above the vertical level of the already deposited hardmask (i.e., above the recessed area) or be located entirely within (horizontally and vertically) the recessed area. Afterwards, the exposed hardmask as well as portions of the top MTJ, tunnel barrier, and bottom MTJ films may be removed and etched using RIE dry etch techniques stopping on the low-k ILD. In an embodiment, an in-situ plasma ash process may be included in the etch recipe to remove any remaining resist residue. This may result in an embodiment similar to that of FIG. 10. From that stage the processed depicted in FIGS. 11-23 may be followed to further develop the embodiment.

In another embodiment the same product as that of FIG. 1 is produced. The process and embodiments of FIGS. 2-6 are used. However, going forward from the product of FIG. 6 a resist layer is applied and patterned over those areas of the wafer surface where MTJs are desired, directly on top of the unpatterned hardmask and MTJ film stack. Thus, for the example of FIG. 6 this would result in 3 resist pillars respectively located directly above the 3 metal portions that will serve as foundations for 3 MTJs (all located within the recessed area of the wafer between the two nearly orthogonal horizontal to vertical MTJ stack transitions shown in FIG. 6).

Afterwards, the exposed hardmask material is etched using dry etch techniques, and any remaining resist is removed using a plasma ash process. At this point, the entire MTJ stack layer shown in FIG. 6 is still present, such that there is a non-recessed MTJ layer portion coupled via vertical MTJ portions to a recessed MTJ portion. However, all hardmask material is removed except for 3 small islands of hardmask located what will become 3 MTJs.

Next the top MTJ film stack is etched using RIE dry etch techniques stopping on the tunnel barrier material. Thus, the top MTJ film remains only in the recessed portion as well as the vertical top MTJ film portions (that previously connected to the horizontal unrecessed top MTJ layer). Afterwards the wafer surface is covered with a "spacer" film, such as silicon nitride or carbon doped silicon nitride. Then an anisotropic dry etch process is used to remove the spacer material from all of the horizontal surfaces of the wafer while leaving the spacer material on the vertical sidewalls. There are now 6 vertical sidewalls located adjacent the remaining top MTJ and hardmask islands in the recessed area. There are also 2 vertical sidewall portions located adjacent the vertical top MTJ layers that are still present. Continuing on, the tunnel barrier and bottom MTJ films are now etched using RIE dry etch techniques, stopping on the underlying M1 interconnect and/or ILD materials. This may result in an embodiment similar to that of FIG. 16. From that stage the process depicted in FIGS. 17-23 may be followed to further develop the embodiment.

At locations above passages such as the following are made: "6 vertical sidewalls located adjacent the remaining top MTJ and hardmask islands in the recessed area". However, these are merely examples shown to illustrate what could be 6 of hundreds or thousands of MTJ portions depending on the product within which the MTJs are eventually incorporated.

Accordingly, various processes have been addressed above, any of which may result in the embodiment of FIG. 1.

FIG. 1 depicts a cross-section of a device having: (a) different ILD materials in the logic area as opposed to the MTJ array area. For example, a single horizontal plane intersects the 3 MTJs, ILD 170, as well as ILD portions in logic area 105. The ILD portions in logic area 105 may include ILD materials different from that of ILD 170 located in area 110. For example, the ILD portions in logic area 105 may include silicon oxide ILD materials and the ILD portions in MTJ area 110 may include flowable oxide. However, in other embodiments the ILD materials may be the same.

FIG. 1 depicts a cross-section of a device having: (b) remnants of the MTJ film stack at the perimeter of the MTJ array area. For example, area 126 of FIG. 1 includes horizontal and vertical portions of bottom MTJ 140, horizontal and vertical portions of tunnel barrier 135, and vertical portions of top MTJ 140. While only area 126 is labeled, notably a symmetric MTJ film stack remnant is also located opposite area 216 across MTJ area 110. In another embodiment stack remnants include horizontal and vertical portions of bottom MTJ 140, horizontal and vertical portions of tunnel barrier 135, and horizontal and vertical portions of top MTJ 140. In another embodiment stack remnants include vertical portions of bottom MTJ 140, vertical portions of tunnel barrier 135, and vertical portions of top MTJ 140. In another embodiment stack remnants include vertical portions of bottom MTJ 140, vertical portions of tunnel barrier 135, and horizontal and vertical portions of top MTJ 140.

FIG. 1 depicts a cross-section of a device having: (c) presence of a sidewall spacer on the edges of the patterned hardmask and/or top MTJ films. For example, there are 3 MTJs shown in FIG. 1. The top MTJ layer 125 for each of the MTJs is located adjacent two vertical spacer portions (sidewall spacers). These sidewall spacers are also adjacent and on the edge of the hardmask portions that are atop the 3 MTJs. However, in other embodiments the spacers may be directly adjacent and contacting only one of the top MTJ and hardmask layers.

FIG. 1 depicts a cross-section of a device having: (d) horizontal separation between the edges of the top MTJ films compared to the edges of the tunnel barrier and the bottom MTJ films. For example, for each MTJ the overall horizontal width of the top MTJ layer is less than the overall width of the corresponding tunnel barrier and/or the overall horizontal width of the top MTJ layer is less than the overall width of the corresponding bottom MTJ layer. The differential between the width of the tunnel barrier and top MTJ layer is equal to the width of the two spacer sidewalls. The differential between the width of the bottom MTJ layer and top MTJ layer is equal to the width of the two spacer sidewalls. In some embodiments the bottom MTJ layer and the tunnel barrier have the same widths for some or all MTJs but in other embodiments they are not the same for some or all MTJs.

FIG. 1 depicts a cross-section of a device having: (e) remnants of the polish-stop film on the edges of the tunnel barrier and bottom MTJ films. For example, there are 3 MTJs shown in FIG. 1. The tunnel barrier and/or bottom MTJ layer 140 for each of the MTJs is located adjacent and directly contacting polish stop portions. The polish stop portions may be vertical portions. These vertical polish stop portions may also be adjacent portions of vertical sidewall spacers.

Embodiments may have various combinations such as any combination of the immediately aforementioned elements (a), (b), (c), (d), and/or (e).

As used herein a layer may have sublayers. For example, a top MTJ layer may actually be composed of many sublayers. For example and as explained above, in one embodiment MTJ film 140 consists of (from bottom to top) 3 nm tantalum (Ta); 20 nm platinum manganese (PtMn); 2.3 nm cobalt iron ($Co_{70}Fe_{30}$); 0.8 nm Ruthenium (Ru); 2.5 nm cobalt iron boron ($Co_{60}Fe_{20}B_{20}$). Thus, 5 sublayers are included in MTJ film 140. Tunnel barrier 135 includes 1.2 nm magnesium oxide (MgO) but in alternative embodiments layer 135 may include one or more sublayers. Top MTJ 125 film includes 2.5 nm $Co_{60}Fe_{20}B_{20}$ but in alternative embodiments the layer may include one or more sublayers. Hardmask 130 material includes 50 nm Ta but in alternative embodiments the layer may include tantalum nitride, titanium and titanium nitride and/or one or more sublayers. For example, an embodiment may include a top MTJ film with sublayers (1.7 nm Co60Fe20B20/5 nm Ta/5 nm Ru), a tunnel barrier (0.85 nm MgO), and a bottom MTJ film with sublayers (5 nm Ta/1 nm Co60Fe20B20). Another embodiment may include a top MTJ film with sublayers (1.0-1.7 nm Co60Fe20B20/5 nm Ta/5 nm Ru), a tunnel barrier (0.85-0.9 nm MgO), and a bottom MTJ film with sublayers (5 nm Ta/10 nm Ru/5 nm Ta/1.0-1.3 nm $Co_{60}Fe_{20}B_{20}$). Another embodiment may include a top MTJ film with sublayers (CoFeB), a tunnel barrier (MgO), and a bottom MTJ film with sublayers (PtMn/CoFe/Ru/CoFeB). Another embodiment may include a top MTJ film with sublayers (CoFeB(3 nm)/Ru(7 nm)/Cu(110 nm)/Ru(2 nm)/Ta(10 nm) or CoFeB(3 nm)/Ta(8 nm)/Ru(7 nm)), a tunnel barrier with sublayers (Mg(0.4 nm)+MgO(0.6 nm)), and a bottom MTJ film with sublayers (Ta(5 nm)/CuN(20 nm)/Ta(10 nm)/PtMn (15 nm)/CoFe(2.5 nm)/Ru(0.8 nm)/CoFeB(3 nm)). Many other examples are possible and understood to those of ordinary skill in the art and are not described herein for purposes of brevity.

Figure 25:
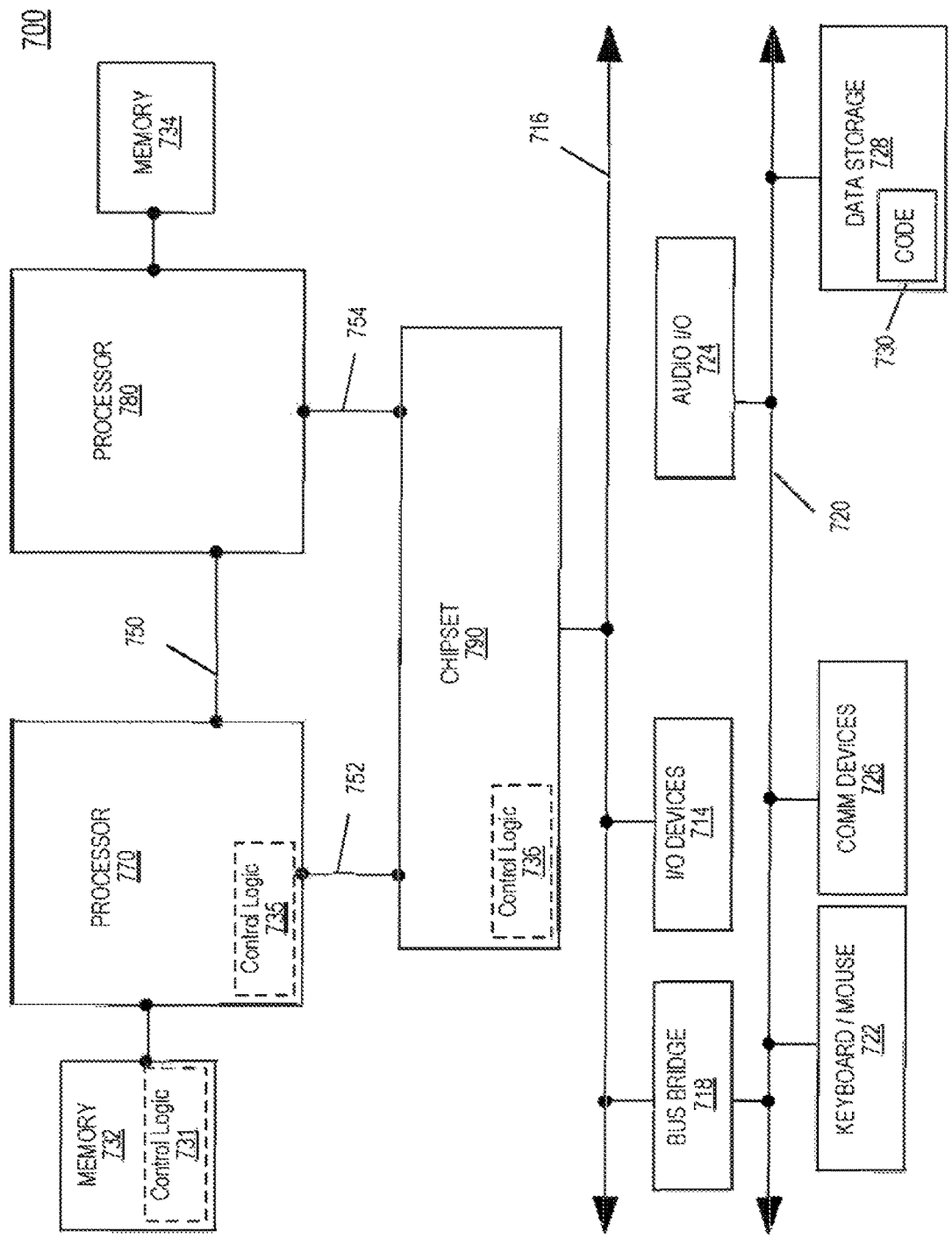
FIG. 25 depicts a system for use with embodiments of the invention.

Embodiments may be used in many different types of systems. For example, in one embodiment a communication device (e.g., cell phone, Smartphone, netbook, notebook, personal computer, watch, camera) can be arranged to include various embodiments described herein. Referring now to FIG. 25, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM)) locally attached to the respective processors. However, the processors may be located on the same chip as memory as described herein. First processor 770 and second processor 780 may be coupled to a chipset 790 via P-P interconnects, respectively. Chipset 790 may include P-P interfaces. Furthermore, chipset 790 may be coupled to a first bus 716 via an interface. Various input/output (I/O) devices 714 may be coupled to first bus 716, along with a bus bridge 718, which couples first bus 716 to a second bus 720. Various devices may be coupled to second bus 720 including, for example, a keyboard/mouse 722, communication devices 726, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 720.

Notably, at times herein "top MTJ" and "bottom MTJ" layers are used for purposes of explanation, however, a MTJ can be "inverted" making the top layer into the bottom layer (i.e., changing the viewing perspective) without deviating from innovative concepts of embodiments described herein.

As a further example, at least one machine readable medium comprises a plurality of instructions that in response to being executed on a computing device, cause the computing device to carry out any of the methods described herein. An apparatus for processing instructions may be configured to perform the method of any of the methods described herein. And an apparatus may further include means for performing any of the methods described herein.

Embodiments may be implemented in code and may be stored on a machine readable storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following examples pertain to further embodiments.

Example 1 includes an apparatus comprising: a first magnetic tunnel junction (MTJ) including a first upper MTJ layer, a first lower MTJ layer, and a first tunnel barrier directly contacting a first lower surface of the first upper MTJ layer and a first upper surface of the first lower MTJ layer; wherein the first upper MTJ layer includes a first upper MTJ layer sidewall and the first lower MTJ layer includes a first lower MTJ sidewall horizontally offset from the first upper MTJ layer sidewall by a first horizontal offset space that defines a first horizontal offset distance.

In Example 2, the subject matter of Example 1 can optionally include a first spacer, having a first width equal to the first horizontal offset distance, directly contacts the first upper MTJ layer and the first tunnel barrier.

In Example 3, the subject matter of Examples 1-2 can optionally include a first hardmask directly contacting a first upper surface of the first upper MTJ layer and the first spacer.

In Example 4, the subject matter of Examples 1-3 can optionally include a first spacer is included within the first horizontal offset space.

In Example 5, the subject matter of Examples 1-4 can optionally include a monolithic substrate; a memory area including the first MTJ; a logic area; and a first horizontal plane parallel to the first lower surface of the first upper MTJ layer; wherein the logic area and the memory are both located on the monolithic substrate; wherein the first horizontal plane intersects the first MTJ, a first Inter-Layer Dielectric (ILD) material adjacent the first MTJ, and a second ILD material included in the logic area, the first and second ILD materials being unequal to one another. The logic area may include logic gates and the memory area may include a memory array.

In Example 6, the subject matter of Examples 1-5 can optionally include the logic area included in a processor and the memory is spin torque transfer magnetoresistive random access memory (STT-MRAM).

In Example 7, the subject matter of Examples 1-6 can optionally include the first ILD material includes at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene and the second ILD material includes an additional at least one of silicon oxide, silicon oxynitride, porous silicon oxide, fluorinated silicon oxide, carbon-doped oxide, porous carbon-doped oxide, polyimide, polynorbornene, benzocyclobutene, flowable oxide, and polytetrafluoroethylene; and the first bottom MTJ includes sublayers comprising at least two of tantalum, platinum manganese; cobalt iron; Ruthenium (Ru); and cobalt iron boron.

In Example 8, the subject matter of Examples 1-7 can optionally include the first horizontal plane intersects a first polish stop material included between the first MTJ and the first ILD material.

In Example 9, the subject matter of Examples 1-8 can optionally include the first polish stop material directly contacts at least one of the first tunnel barrier and the first lower MTJ layer.

In Example 10, the subject matter of Examples 1-9 can optionally include a monolithic substrate; a memory area including the first MTJ; a logic area; and a first horizontal plane parallel to the first lower surface of the first upper MTJ layer; wherein a first spacer, having a width equal to the first horizontal offset distance, directly contacts the first upper MTJ layer and the first tunnel barrier; wherein the logic area and the memory are both located on the monolithic substrate; wherein the first horizontal plane intersects the first MTJ, a first ILD material adjacent the first MTJ, and a second ILD material included in the logic area, the first and second ILD materials being unequal to one another.

In Example 11, the subject matter of Examples 1-10 can optionally include a vertical MTJ layer portion, an additional vertical MTJ layer portion, and a vertical tunnel barrier portion directly contacting the vertical MTJ layer portion and the additional vertical MTJ layer portion; wherein the vertical MTJ layer portion, the additional vertical MTJ layer portion, and the vertical tunnel barrier portion are all between the logic and memory areas and are all intersected by the first horizontal plane.

In Example 12, the subject matter of Examples 1-11 can optionally include wherein at least one of the first upper MTJ layer, first lower MTJ layer, and first tunnel barrier includes sublayers.

In Example 13, the subject matter of Examples 1-12 can optionally include wherein a first spacer, having a first width equal to the first horizontal offset distance, directly contacts at least one of the first upper MTJ layer and the first tunnel barrier.

In Example 14, the subject matter of Examples 1-13 can optionally include a second MTJ including a second upper MTJ layer, a second lower MTJ layer, and a second tunnel barrier directly contacting a second lower surface of the second upper MTJ layer and a second upper surface of the second lower MTJ layer; wherein the second upper MTJ layer includes a second upper MTJ layer sidewall and the second lower MTJ layer includes a second lower MTJ sidewall horizontally offset from the second upper MTJ layer sidewall by a second horizontal offset space that defines a second horizontal offset distance; a first vertical polish stop sidewall contacting at least one of the first lower MTJ layer and the first tunnel barrier and a second vertical polish stop sidewall contacting at least one of the second lower MTJ layer and the second tunnel barrier; wherein the first and second vertical polish stop sidewalls are located between the first and second MTJs and a first horizontal plane parallel to the first lower surface of the first upper MTJ layer intersects the first and second MTJs and the first and second vertical polish stop sidewalls.

Example 15 includes an apparatus comprising: a monolithic substrate; a memory area, comprising a magnetic tunnel junction (MTJ) that includes a tunnel barrier directly contacting lower and upper MTJ layers, located on the substrate; and a logic area located on the substrate; wherein a horizontal plane, which is parallel to the tunnel barrier, intersects the MTJ, a first Inter-Layer Dielectric (ILD) material adjacent the MTJ, and a second ILD material included in the logic area, the first and second ILD materials being unequal to one another. The logic area may include logic gates and the memory area may include a memory array. The logic area may include a processor and the memory area may include a memory array.

In Example 16, the subject matter of Example 15 can optionally include wherein the upper MTJ layer includes an upper MTJ layer sidewall and the lower MTJ layer includes a lower MTJ sidewall horizontally offset from the upper MTJ layer sidewall by a horizontal offset space that defines a horizontal offset distance.

In Example 17, the subject matter of Examples 15-16 can optionally include a spacer, having a width equal to the horizontal offset distance, directly contacting the upper MTJ layer and the tunnel barrier.

In Example 18, the subject matter of Examples 15-17 can optionally include a hardmask directly contacting an upper surface of the upper MTJ layer and the spacer.

In Example 19, the subject matter of Examples 15-18 can optionally include wherein the horizontal plane intersects polish stop material included between the MTJ and the first ILD material.

In Example 20, the subject matter of Examples 15-19 can optionally include wherein the polish stop material directly contacts at least one of the tunnel barrier and the lower MTJ layer.

Example 21 includes a method comprising: forming a memory area, comprising a magnetic tunnel junction (MTJ) that includes a tunnel barrier directly contacting lower and upper MTJ layers, on a monolithic substrate; and forming a logic area located on the substrate; wherein a horizontal plane, which is parallel to the tunnel barrier, intersects the MTJ, a first Inter-Layer Dielectric (ILD) material adjacent the MTJ, and a second ILD material included in the logic area, the first and second ILD materials being unequal to one another. The logic area may include logic gates and the memory area may include a memory array. The logic area may include a processor and the memory area may include a memory array.

In Example 22, the subject matter of Example 21 can optionally include forming a sidewall of the upper MTJ layer horizontally offset a horizontal offset distance from a sidewall of the lower MTJ layer.

In Example 23, the subject matter of Examples 21-22 can optionally include forming a hardmask directly contacting an upper surface of the upper MTJ layer; and forming comprising a spacer, having a width equal to the horizontal offset distance, in direct contact with the upper MTJ layer and the tunnel barrier; wherein forming the hardmask and the spacer includes forming the hardmask and the spacer under a single vacuum without discontinuing the single vacuum between forming the hardmask and the spacer.

In Example 24, the subject matter of Examples 21-23 can optionally include all without discontinuing a single vacuum condition, (a) forming a hardmask directly contacting the upper MTJ layer; (b) forming a spacer, having a width equal to the horizontal offset distance, in direct contact with the upper MTJ layer and the tunnel barrier; (c) etching the upper MTJ layer, tunnel barrier, and lower MTJ layer to form the MTJ; and (d) forming an etch stop film on the MTJ.

In Example 25, the subject matter of Examples 21-24 can optionally include forming sacrificial light absorbing material (SLAM) between vertical portions of the top MTJ layer; and polishing the SLAM.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A magnetic random access memory structure, comprising:
    a first material layer comprising tantalum; a second material layer on the first material layer, the second material layer comprising platinum and manganese;
    a third material layer on the second material layer, the third material layer comprising cobalt and iron;
    a fourth material layer on the third material layer, the fourth material layer comprising ruthenium;
    a fifth material layer on the fourth material layer, the fifth material layer comprising cobalt, iron and boron, the fifth material layer having a first lateral width;
    a tunnel barrier layer on the fifth material layer, the tunnel barrier layer comprising magnesium and oxygen;
    a sixth material layer on the tunnel barrier layer, the sixth material layer comprising cobalt, iron and boron, the sixth material layer having an uppermost surface;
    a seventh material layer above the sixth material layer, the seventh material layer comprising tantalum, and the seventh material layer having a second lateral width less than the first lateral width;
    a spacer along sidewalls of the seventh material layer, the spacer having a bottommost surface above the uppermost surface of the sixth material layer.

2. The magnetic random access memory structure of claim 1, wherein the first material layer has a thickness of 3 nanometers.

3. The magnetic random access memory structure of claim 1, wherein the second material layer has a thickness of 20 nanometers.

4. The magnetic random access memory structure of claim 1, wherein the third material layer has a thickness of 2.3 nanometers.

5. The magnetic random access memory structure of claim 1, wherein the fourth material layer has a thickness of 0.8 nanometers.

6. The magnetic random access memory structure of claim 1, wherein the fifth material layer has a thickness of 2.5 nanometers.

7. The magnetic random access memory structure of claim 1, wherein the tunnel barrier layer has a thickness of 1.2 nanometers.

8. The magnetic random access memory structure of claim 1, wherein the sixth material layer has a thickness of 2.5 nanometers.

9. The magnetic random access memory structure of claim 1, wherein the seventh material layer has a thickness of 50 nanometers.

10. The magnetic random access memory structure of claim 1, wherein the fifth and sixth material layers comprise $Co_{60}Fe_{20}B_{20}$.

11. The magnetic random access memory structure of claim 1, wherein the spacer comprises oxygen.

12. The magnetic random access memory structure of claim 11, wherein the spacer comprises silicon oxide or silicon oxynitride.

13. A magnetic random access memory structure, comprising:
- a first material layer comprising tantalum;
- a second material layer on the first material layer, the second material layer comprising platinum and manganese;
- a third material layer on the second material layer, the third material layer comprising cobalt and iron;
- a fourth material layer on the third material layer, the fourth material layer comprising ruthenium;
- a bottom magnetic tunnel junction layer on the fourth material layer, the bottom magnetic tunnel junction layer comprising cobalt, iron and boron, the bottom magnetic tunnel junction layer having a first lateral width;
- a tunnel barrier layer on the bottom magnetic tunnel junction layer, the tunnel barrier layer comprising magnesium and oxygen;
- a top magnetic tunnel junction layer on the tunnel barrier layer, the top magnetic tunnel junction layer comprising cobalt, iron and boron, the top magnetic tunnel junction layer having an uppermost surface;
- a hardmask above the top magnetic tunnel junction layer, the hardmask comprising tantalum, and the hardmask having a second lateral width less than the first lateral width;
- a spacer along sidewalls of the hardmask, the spacer having a bottommost surface above the uppermost surface of the top magnetic tunnel junction layer.

14. The magnetic random access memory structure of claim 13, wherein the first material layer has a thickness of 3 nanometers, wherein the second material layer has a thickness of 20 nanometers, wherein the third material layer has a thickness of 2.3 nanometers, and wherein the fourth material layer has a thickness of 0.8 nanometers.

15. The magnetic random access memory structure of claim 13, wherein the bottom magnetic tunnel junction layer has a thickness of 2.5 nanometers, wherein the tunnel barrier layer has a thickness of 1.2 nanometers, and wherein the top magnetic tunnel junction layer has a thickness of 2.5 nanometers.

16. The magnetic random access memory structure of claim 13, wherein the hardmask has a thickness of 50 nanometers.

17. The magnetic random access memory structure of claim 13, wherein the hardmask is a conductive hardmask.

18. The magnetic random access memory structure of claim 13, wherein the bottom magnetic tunnel junction layer and the top magnetic tunnel junction layer comprise $Co_{60}Fe_{20}B_{20}$.

19. The magnetic random access memory structure of claim 13, wherein the spacer comprises oxygen.

20. The magnetic random access memory structure of claim 19, wherein the spacer comprises silicon oxide or silicon oxynitride.

* * * * *